United States Patent
An et al.

(10) Patent No.: US 10,234,510 B2
(45) Date of Patent: Mar. 19, 2019

(54) SOC MANAGEMENT SYSTEM OF ENERGY STORAGE DEVICE, AND METHOD THEREFOR

(71) Applicant: HYOSUNG HEAVY INDUSTRIES CORPORATION, Seoul (KR)

(72) Inventors: Geon Ho An, Incheon (KR); In Sun Choi, Gunpo-si (KR); Dong Jun Won, Incheon (KR); Jin Young Choi, Bucheon-si (KR); Sang Ji Lee, Wonju-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 0 days.

(21) Appl. No.: 15/538,205

(22) PCT Filed: Dec. 22, 2015

(86) PCT No.: PCT/KR2015/014130
§ 371 (c)(1),
(2) Date: Jun. 21, 2017

(87) PCT Pub. No.: WO2016/105104
PCT Pub. Date: Jun. 30, 2016

(65) Prior Publication Data
US 2018/0003772 A1  Jan. 4, 2018

(30) Foreign Application Priority Data
Dec. 22, 2014 (KR) .................. 10-2014-0186501

(51) Int. Cl.
*G01R 31/26* (2014.01)
*G01R 31/36* (2006.01)
*G06Q 50/06* (2012.01)

(52) U.S. Cl.
CPC ....... *G01R 31/361* (2013.01); *G01R 31/2612* (2013.01); *G01R 31/3648* (2013.01); *G06Q 50/06* (2013.01)

(58) Field of Classification Search
CPC .................................................. G01R 31/361
(Continued)

(56) References Cited

U.S. PATENT DOCUMENTS

2014/0114495 A1* 4/2014 Larsson ............... H02J 3/1828
                                                    700/297
2016/0079778 A1* 3/2016 Howe .................... H02J 3/32
                                                    320/112

FOREIGN PATENT DOCUMENTS

JP       2003084017 A    3/2003
KR    1020090065931 A    6/2009
(Continued)

OTHER PUBLICATIONS

International Search Report in International Application No. PCT/KR2015/014130, dated Mar. 31, 2016.

*Primary Examiner* — David V Henze-Gongola
(74) *Attorney, Agent, or Firm* — Novick, Kim & Lee, PLLC; Jae Youn Kim

(57) ABSTRACT

The present invention relates to a state of charge (SOC) management system of an energy storage device, the system comprising at least one energy storage device, wherein the SOC management system of the energy storage device manages SOC of the energy storage device by performing P-f (active power-frequency) droop control on the basis of a droop coefficient, a reference frequency, and a dead band, which determine the output of each energy storage device.

8 Claims, 3 Drawing Sheets

(58) Field of Classification Search
USPC .......................................................... 320/132
See application file for complete search history.

(56) References Cited

FOREIGN PATENT DOCUMENTS

| KR | 1020110092714 A | 8/2011 | |
| KR | 101322617 B1 | 10/2013 | |
| KR | 1020140130890 A | 11/2014 | |
| WO | WO 2012175130 A1 * | 12/2012 | ............ H02J 3/1828 |

* cited by examiner

SOC MANAGEMENT SYSTEM OF ENERGY STORAGE DEVICE, AND METHOD THEREFOR

CROSS-REFERENCE TO RELATED APPLICATIONS

This application is the National Stage filing under 35 U.S.C. 371 of International Application No. PCT/KR2015/014130, filed on Dec. 22, 2015, which claims the benefit of Korean Patent Application No. 10-2014-0186501, filed on Dec. 22, 2014, the contents of which are all hereby incorporated by reference herein in their entirety.

TECHNICAL FIELD

The present invention relates to an SOC management system and an SOC management method for an energy storage device, and more particularly, to an SOC management system and an SOC management method for an energy storage device, capable of providing reliability to a system operator and improving system efficiency by performing a frequency control operation using an energy storage device having a fast output response in consideration of a state of charge (SOC) of each device.

BACKGROUND ART

In general, in order to provide high quality electric power by minimizing a frequency variation depending on a variation of the load, it is necessary to maintain a constant frequency by determining priorities of a plurality of energy storage devices depending on state of charges (SOCs) of each energy storage device and charging or discharging each energy storage device as necessary on a priority basis.

In the case of an energy storage device of the related art, discharging is performed if a frequency supplied to a power grid system is lower than a predetermined value. Meanwhile, charging is performed if the frequency supplied to the power grid system is higher than the predetermined value. In addition, a separate reserve power unit compares the SOCs of a plurality of energy storage devices and determines the priorities of the energy storage devices and how many energy storage devices participate in the market.

That is, in the technique of the related art, how many energy storage devices participate in the market or which one is rejected is determined by determining the priorities of the energy storage devices depending on the SOCs of the energy storage devices In addition, the energy is discharged if the frequency supplied to the power grid system decreases. Meanwhile, the energy is charged if the frequency supplied to the power grid system increases.

However, in the technique of the related art, an energy storage device may be rejected from the power grid system if its SOC exceeds another reference level.

In such a system, the rejected energy storage device may fail to respond to a frequency control signal. This may reduce a user's incentive chance, and a user may suffer from any disadvantage caused by failing to participate in the frequency control.

Therefore, it is demanded to provide a system capable of stably managing the SOCs of the energy storage devices.

SUMMARY OF THE INVENTION

Technical Problem

In view of the aforementioned problems, the present invention provides an SOC management system and an SOC management method for an energy storage device, capable of increasing a total system generation energy amount by allowing a generator that has been driven to output a fluctuating generation power in the past to provide a constant output power as the energy storage device performs a frequency response ancillary service.

The present invention also provides an SOC management system and an SOC management method for an energy storage device, capable of implementing a governor free control (FGC) based on an active power/frequency (P-f) droop control for an energy storage device and an SOC management algorithm considering the SOC of the energy storage device to allow the energy storage device to participate in the frequency control without being rejected.

Technical Solution

According to an aspect of the present invention, there is provided a state of charge (SOC) management system for managing an energy storage system including at least an energy storage device, wherein the SOC management system manages the SOC of the energy storage device by performing an active power/frequency (P-f) droop control based on a droop coefficient, a reference frequency, and a dead band to determine an output power of each energy storage device.

According to another aspect of the present invention, there is provided a state of charge (SOC) management method in an SOC management system for managing an energy storage system including at least an energy storage device, wherein the SOC management system manages the SOC of the energy storage device by performing an active power/frequency (P-f) droop control based on a droop coefficient, a reference frequency, and a dead band to determine output power of each energy storage device.

Advantageous Effects

As described above, using the SOC management system and the SOC management method for the energy storage device according to the present invention, it is possible to increase a total system generation energy amount by allowing a generator that has been driven to output a fluctuating generation power in the past to provide a constant output power as the energy storage device performs a frequency response ancillary service.

In addition, using the SOC management system and the SOC management method for the energy storage device according to the present invention, it is possible to provide an energy management system capable of increasing efficiency and maximizing a profit by flexibly managing energy depending on the SOC through the P-f droop control to allow the energy storage device to participate in a lot of markets.

DESCRIPTION OF EMBODIMENTS

Figure 1:
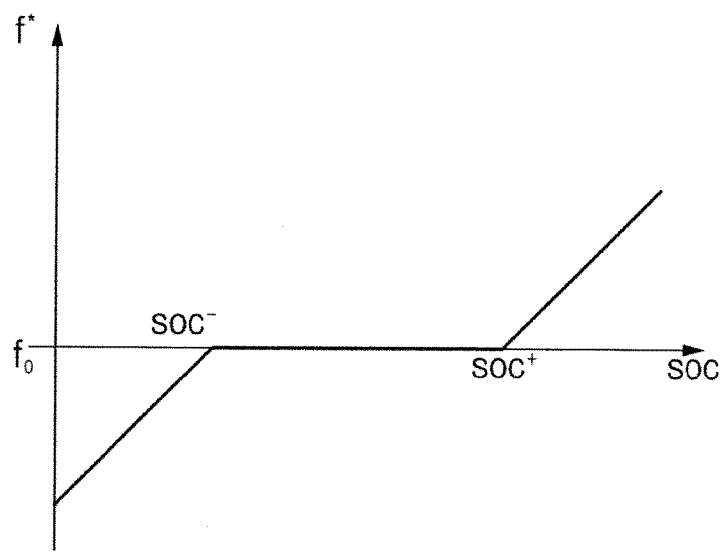
FIG. 1 is a graph illustrating a P-f droop control according to an embodiment of the present invention.

Preferred embodiments of the present invention will now be described in details with reference to the accompanying drawings. Note that like reference numerals denote like elements through the drawings. In the following description, any configuration or function well known in the art may not be described if its detailed description obscures a subject matter of the present invention.

Various aspects of the present invention will now be described. The inventions disclosed herein may be embodied in various forms. Therefore, it would be appreciated that any particular structure and/or function disclosed herein is merely for illustrative purposes. A person ordinarily skilled in the art would appreciate that any aspect disclosed herein may be embodied independently from any other aspect, and two or more aspects may be combined in various manners on the basis of this disclosure. For example, a device or method may be implemented or embodied using any number of aspects described herein. In addition, such a device or method may be implemented in addition to one or more aspects disclosed herein or using any structure and/or function other than these aspects.

Preferred embodiments of the present invention will now be described in details with reference to the accompanying drawings.

FIG. 1 is a graph illustrating a P-f droop control according to an embodiment of the present invention.

An SOC management system for an energy storage device according to the present invention manages a state of charge (SOC) of the energy storage device by performing an active power/frequency (P-f) droop control. FIG. 1 is a graph illustrating a droop coefficient $R_f$ used to determine the output power depending on a frequency, a dead band ($f^-_{db}$, $f^+_{db}$) that does not respond to a signal, and a reference frequency f in the case of the P-f droop control.

Referring to FIG. 1, an output power amount of the active power and a frequency variation may be determined using the following Formulas 1 and 2.

Formula 1 expresses an output power at a frequency higher than the dead band.

$$P = P_0 + \frac{(f^* + f^+_{db}) - f}{R_f}(f > f^* + f^+_{db}) \quad \text{[Formula 1]}$$

Formula 2 expresses an output power at a frequency lower than the dead band.

$$P = P_0 + \frac{(f^* - f^-_{db}) - f}{R_f}(f > f^* - f^-_{db}) \quad \text{[Formula 2]}$$

In general, the output power of the P-f droop control may be determined by the current system frequency f and the droop coefficient $R_f$.

That is, the energy storage device may receive the current system frequency f as a signal and control the frequency by repeating charging and discharging to match the output power amount determined by Formulas 1 and 2. In this case, the SOC of the energy storage device is expressed as a sum of the current SOC and the remaining SOC after the output operation and may be determined by the following Formulas 3 and 4.

In the following formulas, "$Q_c$" denotes a total storable energy amount (Wh).

Formula 3 expresses an SOC output power for charging.

$$SOC(t+1) = SOC(t) - \frac{1}{\eta_d}\frac{P(t) \cdot \Delta t}{Q_C}(P(t) > 0) \quad \text{[Formula 3]}$$

Formula 4 expresses an SOC output power for discharging.

$$SOC(t+1) = SOC(t) + \frac{1}{\eta_c}\frac{P(t) \cdot \Delta t}{Q_C}(P(t) < 0) \quad \text{[Formula 4]}$$

In Formulas 3 and 4 described above, the SOC may be determined by the output power P(t) at time t and charging/discharging efficiency $\eta_{c,d}$.

In this case, the SOC determined on the basis of the formulas described above is higher than "100" or lower than "0," a normal operation of the energy storage device is impossible. In addition, here, if a user arbitrarily sets the SOC range, and the SOC is lower than a lower limit of the set SOC range or higher than an upper limit of the set SOC range, a normal operation of the energy storage device is impossible.

In this regard, an algorithm for adjusting the charging/discharging ratio can be applied by changing a position of the dead band by adjusting the reference frequency depending on the SOC of the energy storage device.

Figure 2:
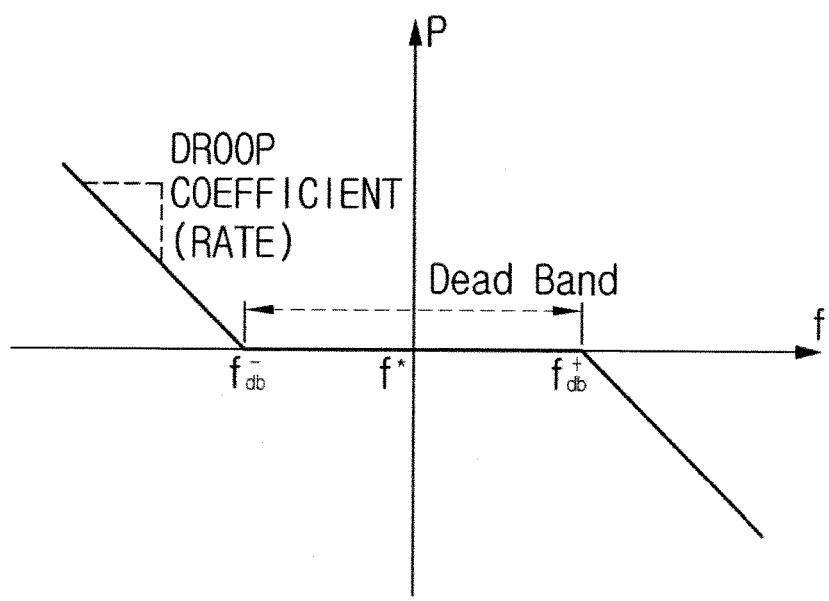
FIG. 2 is a graph illustrating a movement of the reference frequency depending on an SOC of an energy storage device according to an embodiment of the present invention.

FIG. 2 is a graph illustrating a movement of the reference frequency depending on the SOC of the energy storage device according to an embodiment of the present invention.

As illustrated in FIG. 2, the energy storage device according to the present invention may shift the reference frequency by "f*-SOC" on the basis of the SOC.

That is, if the current SOC of the energy storage device exists between the lower limit SOC$^-$ and the upper limit SOC$^+$ of the SOC, a user may set the energy storage device such that the energy storage device outputs power depending on an initial reference frequency $f_0$. In this case, the SOC of the energy storage device that outputs power exceeds the upper limit SOC$^+$, the reference frequency f* increases by "Δf."

Figure 3:
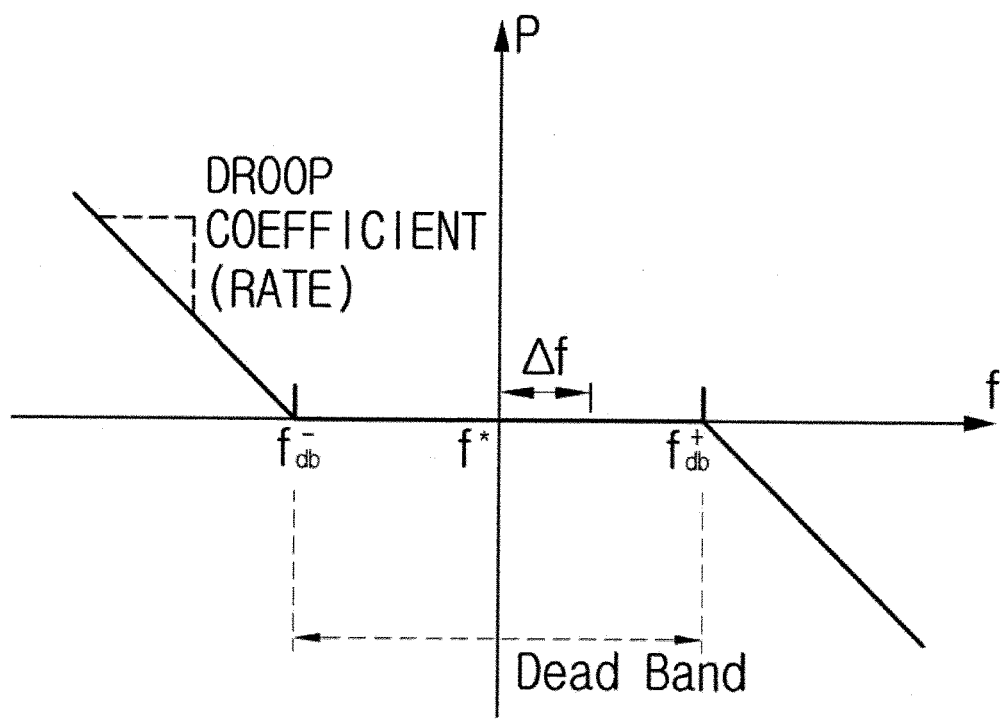
FIG. 3 is a graph illustrating a P-f droop control according to an embodiment of the present invention when the reference frequency is shifted by $\Delta f$.

FIG. 3 is a graph for describing a P-f droop control in which the reference frequency is shifted by "Δf" according to an embodiment of the present invention.

As illustrated in FIG. 3, the reference frequency P is shifted by "Δf" through the P-f droop control according to the present invention. The reference frequency fi is set to 60 Hz, the dead band may change depending on the reference frequency. That is, the dead band may change depending on a variation of the reference frequency. The energy storage device responds to a charging signal as the dead band changes when the dead band is positioned in the charging side. Meanwhile, the energy storage device responds to a discharging signal when the dead band is positioned in the discharging side.

As described above, according to the present invention, the dead band is shifted in response to a variation of the reference frequency f*. Therefore, the energy storage device advantageously stably maintains the SOC by changing the charging/discharging ratio depending on the SOC FIG. 4 is a flowchart illustrating a method of managing the SOC of the energy storage device according to an embodiment of the present invention.

Figure 4:
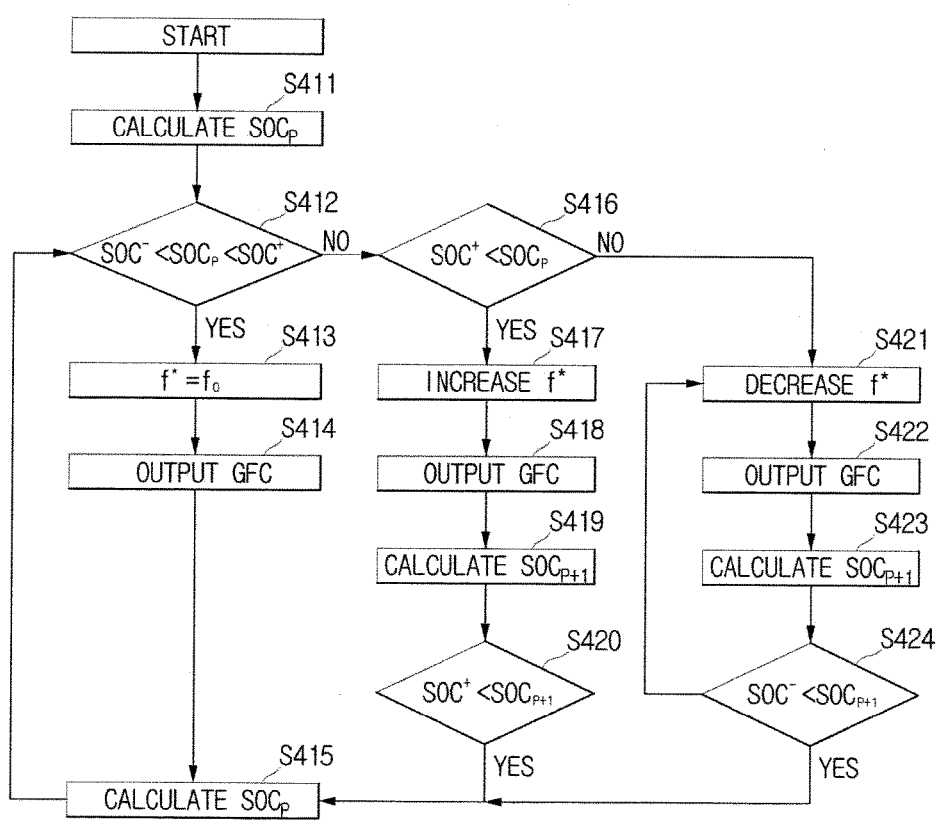
FIG. 4 is a flowchart illustrating an SOC management method for an energy storage device according to an embodiment of the present invention.

As illustrated in FIG. 4, in the method of controlling the SOC of the energy storage device according to the present invention, the charging/discharging range of the energy storage device is actively adjusted by shifting the reference frequency depending on the SOC of each energy storage device. Therefore, it is possible to stably maintain the SOC of the energy storage device.

First, a current SOC calculation process S411 may be performed, in which the SOC management system of the energy storage device calculates the current SOCs of each energy storage device included in the energy storage system. Then, an SOC position determination process S412 is performed, in which it is determined whether or not the calculated SOC is included in a predetermined range ($SOC^-<SOC_P<SOC^+$). In this case, in the current SOC calculation process S411, the SOC of each energy storage device included in the energy storage system may be calculated. In this case, the resulting SOC is referred to as "$SOC_P$," and may be expressed as a percentage (0 to 100%).

If the SOC is within the predetermined range as a result of determination of the SOC position determination process S412, a reference frequency change step S413 may be performed, in which the reference frequency is changed. That is, in the reference frequency change process S413, the reference frequency is maintained, increased, or decreased depending on the current SOC. In other words, if the $SOC_P$ is equal to or higher than the upper limit $SOC^+$, the reference frequency may be increased. If the $SOC_P$ is equal to or lower than the lower limit $SOC^-$, the reference frequency may be decreased. If the $SOC_P$ is positioned between the upper limit $SOC^+$ and the lower limit $SOC^-$, the reference frequency is maintained at the initial reference frequency $f_0$ without a change.

Then, a governor free control (GFC) output process S414 may be performed, in which an output power amount of the energy storage device is determined and output using the reference frequency changed in the reference frequency change process S413. After the output power amount of the energy storage device determined in the GFC output process S414 is output, an SOC re-calculation process S415 may be performed, in which the SOC of the energy storage device is re-calculated on the basis of the output power amount output in the GFC output process S414. That is, in the GFC output process S414, the output power may be calculated using the reference frequency set in the reference frequency f* change process S413. Each energy storage device may output the output power as much as the calculated output power in the process S414 and then advance to the SOC re-calculation process S415. In this case, any energy storage device can advance to the SOC position determination process S412 if the resulting SOC $SOC_P$ is positioned between the upper limit $SOC^+$ and the lower limit $SOC^-$.

After the SOC re-calculation process S415, the SOC of the energy storage device remaining after the GFC is output is calculated. Then, the process may advance to the SOC position re-determination process S416. In this case, the resulting SOC is referred to as $SOC_{P+1}$.

Meanwhile, it is determined whether or not the current SOC calculated in the current SOC calculation process S411 is within a predetermined range ($SOC^-<SOC_P<SOC^+$). If the SOC is not within the predetermined range as a result of the SOC position determination process S412, it may be determined whether or not the current SOC is higher than the post-discharge SOC (S416).

If it is determined that the current SOC is lower than the post-discharge SOC ($SOC^+<SOC_P$) as a result of the determination, the reference frequency is increased (S417), and the GFC is output (S418). Then, the SOC value $SOC_{P+1}$ may be re-calculated by applying the P-f droop control algorithm (S419). Then, the positions of the $SOC_P$ and the $SOC_{P+1}$ calculated in the previous process are re-determined (S420). If the energy storage device having the SOC $SOC_P$ equal to or higher than the upper limit $SOC^+$ still remains in this state, the process advances to the reference frequency fi change process S417, and the reference frequency is increased again.

Meanwhile, if it is determined that the current SOC is higher than the post-discharge SOC ($SOC^+>SOC_P$) as a result of the determination (S416), the reference frequency is decreased (S412), and the GFC is output (S422). In addition, the SOC value $SOC_{P+1}$ is re-calculated by applying the P-f droop control algorithm (S423), and the positions of the SOCs $SOC_P$ and the $SOC_{P+1}$ calculated in the previous process are re-determined (S424).). If the energy storage device having the SOC $SOC_P$ equal to or higher than the upper limit $SOC^-$ still has the recalculated SOC $SOC_{P+1}$ equal to or higher than $SOC^-$, the process advances to the reference frequency f* change process S417, and the reference frequency is increased again.

As described above, using the system and method for managing the SOC of the energy storage device according to the present invention, the energy storage device performs the governor free control (GFC) as a frequency response ancillary service. Therefore, it is possible to increase a total system power generation amount.

In addition, using the system and method for managing the SOC of the energy storage device according to the present invention, the reference frequency is shifted depending on the SOC. Therefore, it is possible to stably maintain the SOC by smoothly controlling an increase of decrease of the SOC of the energy storage device. In addition, since the energy storage device is prevented from being fully charged or discharged in advance, it is possible to improve reliability of the response.

While the present invention has been described hereinbefore regarding particular matters such as specific elements and limited embodiments and drawings, it would be appreciated that these are merely for illustrative purposes and are not intended to limit the scope of the invention. A person ordinarily skilled in the art would conceive various changes and modifications by studying this disclosure.

Therefore, it should be noted that the spirit of the present invention is not to be determined solely by the embodiments described herein in a limitative sense, and the scope of the present invention encompasses not only the claims set forth below, but also their equivalents and variations.

INDUSTRIAL APPLICABILITY

The present invention relates to a method and system for managing the SOC of the energy storage device and is applicable to energy storage devices.

The invention claimed is:
1. A state of charge (SOC) management system for managing an energy storage system including at least one energy storage device, the SOC management system comprising a controller configured to:

manage the SOC of the at least one energy storage device by performing an active power/frequency (P-f) droop control based on a droop coefficient, a reference frequency, and a dead band to determine an output power of each of the at least one energy storage device, and adjust a charging/discharging ratio of the energy storage system by changing a position of the dead band by adjusting the reference frequency depending on the SOC of the at least one energy storage device, wherein the P-f droop control includes:
- a current SOC calculation process in which the SOC management system of the at least one energy storage device calculates the SOC of each of the at least one energy storage device belonging to the energy storage system;
- an SOC position determination process in which it is determined whether or not the SOC calculated in the current SOC determination process is within a predetermined range between an upper limit ($SOC^+$) and a lower limit ($SOC^-$);
- a reference frequency change process in which the reference frequency is changed depending on a result of the determination in the SOC position determination process on whether or not the calculated SOC ($SOC_P$) is within the predetermined range, wherein, if the $SOC_P$ is equal to or higher than the $SOC^+$, the reference frequency is increased, wherein, if the $SOC_P$ is equal to or lower than the $SOC^-$, the reference frequency is decreased, and wherein, if the $SOC_P$ is positioned between the $SOC^+$ and the $SOC^-$, the reference frequency is maintained at an initial reference frequency without a change;
- a governor free control (GFC) output process in which an output power level of the energy storage device is determined and output using the reference frequency changed in the reference frequency change process;
- an SOC re-calculation process in which the SOC of the energy storage device is re-calculated on the basis of the output power level; and
- an SOC position re-determination process in which the SOC recalculated in the SOC re-calculation process is compared with the current SOC calculated in the current SOC calculation process to determine whether or not the process advances to the reference frequency change process or the current SOC calculation process.

2. The SOC management system according to claim 1, wherein the P-f droop control further includes a reference frequency/SOC control to determine the reference frequency depending on the SOC of each of the at least one energy storage device.

3. The SOC management system according to claim 1, wherein the droop coefficient is set to 3%, and the dead band is set to 0.04%.

4. The SOC management system according to claim 1, wherein a control range of the SOC is set to 40 to 60%.

5. A state of charge (SOC) management method in an SOC management system for managing an energy storage system including at least one energy storage device, the SOC management method comprising managing the SOC of the at least one energy storage device by performing an active power/frequency (P-f) droop control based on a droop coefficient, a reference frequency, and a dead band to determine output power of each energy storage device, wherein a charging/discharging ratio of the energy storage system is adjusted by changing a position of the dead band by adjusting the reference frequency depending on the SOC of the at least one energy storage device, wherein the P-f droop control includes:
- a current SOC calculation process in which the SOC management system of the at least one energy storage device calculates the SOC of each of the at least one energy storage device belonging to the energy storage system;
- an SOC position determination process in which it is determined whether or not the SOC calculated in the current SOC determination process is within a predetermined range between an upper limit ($SOC^+$) and a lower limit ($SOC^-$);
- a reference frequency change process in which the reference frequency is changed depending on a result of the determination in the SOC position determination process on whether or not the calculated SOC ($SOC_P$) is within the predetermined range, wherein, if the $SOC_P$ is equal to or higher than the $SOC^+$, the reference frequency is increased, wherein, if the $SOC_P$ is equal to or lower than the $SOC^-$, the reference frequency is decreased, and wherein, if the $SOC_P$ is positioned between the $SOC^+$ and the $SOC^-$, the reference frequency is maintained at an initial reference frequency without a change;
- a governor free control (GFC) output process in which an output power level of the at least one energy storage device is determined and output using the reference frequency changed in the reference frequency change process;
- an SOC re-calculation process in which the SOC of the at least one energy storage device is re-calculated on the basis of the output power level; and
- an SOC position re-determination process in which the SOC recalculated in the SOC re-calculation process is compared with the current SOC calculated in the current SOC calculation process to determine whether or not the process advances to the reference frequency change process or the current SOC calculation process.

6. The SOC management method according to claim 5, wherein the P-f droop control further includes a reference frequency/SOC control to determine the reference frequency depending on the SOC of each of the at least one energy storage device.

7. The SOC management method according to claim 5, wherein the droop coefficient is set to 3%, and the dead band is set to 0.04%.

8. The SOC management method according to claim 1, wherein a control range of the SOC is set to 40 to 60%.

* * * * *